(12) United States Patent
Yura et al.

(10) Patent No.: US 7,598,659 B2
(45) Date of Patent: Oct. 6, 2009

(54) PIEZOELECTRIC CERAMIC AND METHOD OF MANUFACTURING THE SAME

(75) Inventors: Yukinobu Yura, Nagoya (JP); Hirofumi Yamaguchi, Komaki (JP); Ritsu Tanaka, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 120 days.

(21) Appl. No.: 11/685,359

(22) Filed: Mar. 13, 2007

(65) Prior Publication Data
US 2007/0216260 A1    Sep. 20, 2007

(30) Foreign Application Priority Data
Mar. 17, 2006    (JP) .............................. 2006-075397

(51) Int. Cl.
*H01L 41/08*    (2006.01)
(52) U.S. Cl. ...................... 310/358; 310/324; 310/330; 252/62.9 PZ
(58) Field of Classification Search ................ 310/258, 310/259, 328; 252/62.9 PZ
See application file for complete search history.

(56) References Cited

U.S. PATENT DOCUMENTS 4,568,848 A * 2/1986 Ogawa ................... 310/313 B
6,258,459 B1 * 7/2001 Noguchi et al. ............. 428/446
6,265,811 B1 * 7/2001 Takeuchi et al. ............ 310/330
6,387,295 B1 * 5/2002 Saito ...................... 252/62.9 R
6,437,486 B1 * 8/2002 Burcsu et al. ............... 310/358
6,579,468 B2 * 6/2003 Kimura et al. .......... 252/62.9 R
2004/0214723 A1   10/2004 Nonoyama et al.
2005/0006618 A1    1/2005 Nanao et al.

FOREIGN PATENT DOCUMENTS

JP    2003-221276    8/2003
JP    2004-002051    1/2004
JP    2004-300019    10/2004
JP    2005-228865    8/2005

* cited by examiner

*Primary Examiner*—Mark Budd
(74) *Attorney, Agent, or Firm*—Burr & Brown (57) ABSTRACT

A piezoelectric/electrostrictive device which exhibits an excellent piezoelectric characteristic and which has only a small dependence on a temperature is provided. The piezoelectric/electrostrictive device includes a piezoelectric/electrostrictive portion made of a piezoelectric ceramic, and electrodes electrically connected to the piezoelectric/electrostrictive portion. The piezoelectric ceramic reversibly transits to a tetragonal phase and an orthorhombic phase at a phase transition point as a boundary. The piezoelectric/electrostrictive portion is formed by a polarization treatment performed under the conditions that a treatment temperature ranges from a first temperature which exceeds the phase transition point of the piezoelectric ceramic to a second temperature which is 50° C. higher than the first temperature.

10 Claims, 5 Drawing Sheets

PIEZOELECTRIC CERAMIC AND METHOD OF MANUFACTURING THE SAME

BACKGROUND OF THE INVENTION

1. Field of the Invention

The present invention relates to a piezoelectric ceramic having only a small dependence on temperature and exhibiting excellent piezoelectric characteristics, a method of manufacturing the same, and a piezoelectric/electrostrictive device having only a small dependence on temperature and exhibiting excellent piezoelectric characteristics.

2. Description of the Related Art

As a device capable of controlling a micro-displacement on the order of submicrons, a piezoelectric/electrostrictive device has heretofore been known. Especially, the piezoelectric/electrostrictive device includes a piezoelectric/electrostrictive portion constituted of a piezoelectric/electrostrictive porcelain composition (hereinafter simply referred to as the "piezoelectric ceramic") and an electrode portion to which a voltage is to be applied, the portions being laminated on a substrate made of a ceramic. The device is suitable for control of micro-displacement, and additionally has excellent characteristics such as a high electromechanical coupling factor, a high-speed response, a high durability and a saved power consumption. Such a piezoelectric/electrostrictive device is used for various applications such as a piezoelectric pressure sensor, a probe movement mechanism of a scanning tunnel microscope, a rectilinear guide mechanism of an ultra-precise processing device, a servo valve for hydraulic control, a head of a VTR device, pixels constituting a flat panel type image display device and a head of an ink jet printer.

Moreover, the piezoelectric ceramic constituting the piezoelectric/electrostrictive portion has been variously investigated. For example, in recent years, the influence on the global environment by the elution of lead (Pb) due to acid rain has been regarded as a problem. Therefore, in consideration of the influence on the environment, an $(LiNaK)(NbTa)O_3$-based piezoelectric ceramic has been developed which is capable of providing piezoelectric or a piezoelectric device exhibiting excellent piezoelectric/electrostrictive characteristics, even without containing any lead (Pb) (see, e.g., Patent Document 1).

Since the piezoelectric ceramic is a ferroelectric, a polarization treatment needs to be performed in order to utilize a property (a piezoelectric characteristic) of the ceramic incorporated in an electronic device and the like. This polarization treatment refers to a treatment of applying a high voltage to align a direction of spontaneous polarization in a specific direction. The treatment is performed by applying the voltage to the piezoelectric ceramic under appropriate temperature conditions and the like.

As a related conventional technology, a method is disclosed in which the polarization treatment is performed twice in different temperature ranges (see, e.g., Patent Document 2). Another method is disclosed in which heating is performed after the polarization treatment in order to increase a mechanical quality coefficient Qm of the resultant piezoelectric ceramic (see, e.g., Patent Document 3). Furthermore, there are disclosed an oriented crystal ceramic and a method of manufacturing the ceramic constituted of a polycrystalline including a predetermined isotropic perovskite type compound as a main phase and having specific crystal oriented (see, e.g., Patent Document 4).

However, even when the piezoelectric ceramic is subjected to the polarization treatment and the like by the methods disclosed in Patent Documents 2 to 4, a large dependence on temperature raises the problem that the piezoelectric characteristic easily changes with the temperature. The piezoelectric/electrostrictive device in which the piezoelectric ceramic having the large dependence on the temperature is used has the problem that the response in the case where the temperature conditions change easily becomes unstable, and it is difficult to adopt the device in an application requiring a finer displacement.

[Patent Document 1] Japanese Patent Application Laid-Open No. 2003-221276

[Patent Document 2] Japanese Patent Application Laid-Open No. 228865

[Patent Document 3] Japanese Patent Application Laid-Open No. 2004-2051

[Patent Document 4] Japanese Patent Application Laid-Open No. 2004-300019

SUMMARY OF THE INVENTION

The present invention has been developed in view of such problems of the conventional technology, and an object thereof is to provide a piezoelectric ceramic which exhibits excellent piezoelectric characteristics and which has a small dependence on the temperature so that the piezoelectric characteristics do not easily change with the temperature, an efficient method of manufacturing the ceramic, and a piezoelectric/electrostrictive device having only a small dependence on the temperature and exhibiting an excellent piezoelectric characteristics.

To achieve the above object, the present inventors have intensively investigated a piezoelectric ceramic whose phase can reversibly transit to a tetragonal phase and an orthorhombic phase at a phase transition point as a boundary, and they have found that when the ceramic is subjected to a polarization treatment at a predetermined temperature that is higher than the phase transition point of the ceramic, the above object can be achieved, and they have completed the present invention.

Moreover, the present inventors have found that the above object can be achieved in the case where the piezoelectric ceramic is subjected to the polarization treatment under the conditions that a polarization electric field is applied in a direction reverse to a direction in which a driving electric field is applied, and they have completed the present invention.

That is, according to the present invention, there are provided a piezoelectric ceramic, a method of manufacturing the ceramic, and a piezoelectric/electrostrictive device described later.

According to a first aspect of the present invention, a piezoelectric/electrostrictive device (hereinafter referred to also as the "first piezoelectric/electrostrictive device") is provided, comprising: a piezoelectric/electrostrictive portion made of a piezoelectric ceramic; and electrodes electrically connected to the piezoelectric/electrostrictive portion. The piezoelectric ceramic is configured to reversibly transit to a tetragonal phase and an orthorhombic phase at a phase transition point as a boundary. The piezoelectric/electrostrictive portion is formed by a polarization treatment performed under the conditions that the treatment temperature ranges from a first temperature which exceeds the phase transition point of the piezoelectric ceramic to a second temperature which is 50° C. higher than the first temperature.

According to a second aspect of the present invention, a piezoelectric/electrostrictive device (hereinafter referred to also as the "second piezoelectric/electrostrictive device") is provided, comprising: a piezoelectric/electrostrictive portion made of a piezoelectric ceramic; and electrodes electrically connected to the piezoelectric/electrostrictive portion. The piezoelectric/electrostrictive device is driven by a driving electric field applied to the piezoelectric/electrostrictive portion in a predetermined direction, and the piezoelectric/electrostrictive portion is formed by a polarization treatment performed under the conditions that a polarization electric field is applied to the piezoelectric ceramic in a direction reverse to the predetermined direction in which the driving electric field is applied.

According to a third aspect of the present invention, a piezoelectric/electrostrictive device according to the second aspect is provided, wherein the piezoelectric ceramic is configured to reversibly transit to a tetragonal phase and an orthorhombic phase at a phase transition point as a boundary, and the piezoelectric/electrostrictive portion is subjected to the polarization treatment performed under the conditions that a treatment temperature ranges from a first temperature which exceeds the phase transition point of the piezoelectric ceramic to a second temperature which is 50° C. higher than the first temperature.

According to a fourth aspect of the present invention, a piezoelectric/electrostrictive device according to any one of the above aspects is provided, wherein a composition of the piezoelectric ceramic is represented by the following general formula (1)

$$\{Li_y(Na_{1-x}K_x)_{1-y}\}_a(Nb_{1-z}Ta_z)O_3 \qquad (1),$$

in which a=0.90 to 1.2, x=0.2 to 0.8, y=0.02 to 0.2, and z=0.05 to 0.5.

According to a fifth aspect of the present invention, a piezoelectric/electrostrictive device according to any one of the above aspects is provided, wherein a difference between a maximum value and a minimum value of a strain ratio in a range of 25 to 70° C. is 0.2 or less, the ratio being represented by a ratio of a minimum value of a strain with respect to a maximum value of the strain.

According to a sixth aspect of the present invention, a piezoelectric/electrostrictive device according to any one of the above aspects is provided, wherein in the piezoelectric/electrostrictive portion, an absolute value of a difference between a temperature at which a maximum value ($\in_1$) of a dielectric constant measured in a process of raising the temperature is measured and a temperature at which a maximum value ($\in_2$) of a dielectric constant measured in a process of lowering the temperature is measured is 15° C. or less.

According to a seventh aspect of the present invention, piezoelectric/electrostrictive device according to any one of the above aspects is provided, wherein in a chart of the piezoelectric/electrostrictive portion obtained by measurement performed at 25° C. by an X-ray diffraction process, a ratio between an intensity ($S_1$) of a peak which appears at 2θ=45°±1 and an intensity ($S_2$) of a peak which appears at 2θ=46°±1 is in a range of $S_1$:$S_2$=1:5 to 5:1.

According to an eighth aspect of the present invention, a piezoelectric/electrostrictive device according to any one of the above aspects is provided, wherein in the piezoelectric/electrostrictive portion, a mass ratio between a content (T) of tetragonal crystals and a content (R) of orthorhombic crystals at 25° C. is in a range of T:R=2:8 to 10:0.

According to a ninth aspect of the present invention, a piezoelectric/electrostrictive device according to any one of the above aspects is provided, wherein the piezoelectric/electrostrictive portion and the electrodes have film-like shapes, respectively. The piezoelectric/electrostrictive device further comprises a substrate made of a ceramic, wherein the piezoelectric/electrostrictive portion is secured to the substrate directly or via the electrodes.

According to a tenth aspect of the present invention, a piezoelectric/electrostrictive device according to any one of the above aspects is provided, which is used as an actuator or a sensor.

According to an eleventh aspect of the present invention, a method of manufacturing a piezoelectric/electrostrictive device comprising a piezoelectric/electrostrictive portion and electrodes electrically connected to the piezoelectric/electrostrictive portion is provided. The method comprises the steps of subjecting, to a polarization treatment, a piezoelectric ceramic configured to reversibly transit to a tetragonal phase and an orthorhombic phase at a phase transition point as a boundary under the conditions that a treatment temperature ranges from a first temperature which exceeds the phase transition point to a second temperature which is 50° C. higher than the first temperature.

According to a twelfth aspect of the present invention, a method of manufacturing a piezoelectric/electrostrictive device comprising a piezoelectric/electrostrictive portion and electrodes electrically connected to the piezoelectric/electrostrictive portion, wherein the piezoelectric/electrostrictive device is driven when a driving electric field is applied to the piezoelectric/electrostrictive portion in a predetermined direction. The method comprises the steps of subjecting, to a polarization treatment, a piezoelectric ceramic configured to reversibly transit to a tetragonal phase and an orthorhombic phase at a phase transition point as a boundary under the conditions that a polarization electric field is applied to the piezoelectric ceramic in a direction reverse to the predetermined direction in which the driving electric field is applied.

According to a thirteenth aspect of the present invention, a method of manufacturing the piezoelectric/electrostrictive device according to the twelfth aspect is provided, wherein the piezoelectric ceramic is subjected to the polarization treatment under the conditions that a treatment temperature ranges from a first temperature which exceeds the phase transition point to a second temperature which is 50° C. higher than the first temperature.

The first and second piezoelectric/electrostrictive devices of the present invention exhibit excellent piezoelectric characteristics. Moreover, since the device has only a small dependence on the temperature, an effect is produced whereby the piezoelectric characteristics do not easily change with the temperature.

According to the method of manufacturing the piezoelectric/electrostrictive device of the present invention, it is possible to efficiently manufacture the piezoelectric/electrostrictive device exhibiting the excellent piezoelectric characteristic and having the only small dependence on the temperature to such an extent that the piezoelectric characteristic does not easily change with the temperature.

DETAILED DESCRIPTION OF THE INVENTION

The best mode of the present invention will hereinafter be described, but it should be understood that the present invention is not limited to the following embodiments and that the present invention includes appropriate alterations, improvements and the like which are applied to the following embodiments based on ordinary knowledge of a person skilled in the art without departing from the scope of the present invention. It is to be noted that when the phrase "piezoelectric/electrostrictive device of the present invention (the present embodiment)" refers to either of the first piezoelectric/electrostrictive device or the second piezoelectric/electrostrictive device.

One embodiment of the first piezoelectric/electrostrictive device of the present invention is a piezoelectric/electrostrictive device including a piezoelectric/electrostrictive portion made of a piezoelectric ceramic and electrodes electrically connected to the piezoelectric/electrostrictive portion. The piezoelectric ceramic can reversibly transit to a tetragonal phase and an orthorhombic phase at a phase transition point as a boundary. The piezoelectric/electrostrictive portion is formed by a polarization treatment under the conditions that a treatment temperature ranges from a first temperature which exceeds the phase transition point of the piezoelectric ceramic to a second temperature which is 50° C. higher than the first temperature. Details of the device will hereinafter be described.

The piezoelectric/electrostrictive portion constituting the first piezoelectric/electrostrictive device of the present embodiment is a portion formed by polarizing the piezoelectric ceramic under predetermined conditions. Here, the term "piezoelectric ceramic" mentioned in the present specifications refers to a piezoelectric/electrostrictive material for use in forming the piezoelectric/electrostrictive portion, and the material develops its piezoelectric characteristic when subjected to the polarization treatment. It is to be noted that a composition of the piezoelectric ceramic is represented by substantially the same general formula as that of the piezoelectric/electrostrictive portion to be formed.

This piezoelectric ceramic is a ceramic material having a crystal structure capable of reversibly transiting to the tetragonal phase and the orthorhombic phase at the phase transition point as the boundary. More specifically, the piezoelectric ceramic is cubic at high temperatures, and changes so as to be tetragonal with a temperature drop. When the temperature is further lowered, the ceramic transits to the orthorhombic phase at the phase transition point as the boundary.

The piezoelectric/electrostrictive portion constituting the first piezoelectric/electrostrictive device of the present embodiment is a portion formed when subjected to the polarization treatment under the conditions that the treatment temperature ranges from a first temperature exceeding the phase transition point at which the phase reversibly transits to the tetragonal phase and the orthorhombic phase to a second temperature which is 50° C. higher than the first temperature. It is to be noted that the phase transition point of the piezoelectric ceramic depends on the composition of the ceramic, and is usually −30 to 100° C. The piezoelectric/electrostrictive portion of the first piezoelectric/electrostrictive device of the present embodiment is subjected to the polarization treatment in a predetermined range of temperatures higher than the phase transition point. Therefore, the portion exhibits excellent piezoelectric characteristics, and further exhibits a characteristic that the portion has only a small dependence on temperature compared with conventional piezoelectric/electrostrictive devices.

Specific examples of the characteristic that "the portion has only a small dependence on the temperature" include the characteristic that the strain and the dielectric constant change little with the temperature and the characteristic that there is only a small difference between a value of the strain or the dielectric constant measured during temperature rise and a value of the strain or the dielectric constant measured during temperature drop (i.e., a temperature hysteresis is not easily generated). That is, since the first piezoelectric/electrostrictive device of the present embodiment is not easily influenced by the temperature as compared with conventional piezoelectric/electrostrictive devices, the device is preferably adopted in an application requiring a micro-displacement even under situations in which the temperature changes.

The temperature of the polarization treatment ranges from the first temperature which exceeds the phase transition point to the second temperature which is 50° C. higher than the first temperature. However, it is preferable that the piezoelectric/electrostrictive portion constituting the first piezoelectric/electrostrictive device of the present embodiment is a portion formed by the polarization treatment performed under the conditions that the treatment temperature ranges from the first temperature which exceeds the phase transition point to the second temperature which is 50° C. higher than the first temperature. This is because the device exhibits more excellent piezoelectric characteristic and has a further reduced dependence on the temperature. It is further preferable that the piezoelectric/electrostrictive portion is a portion formed by the polarization treatment performed under the conditions that the treatment temperature is 5 to 20° C. higher than the phase transition point.

Next, one embodiment of a second piezoelectric/electrostrictive device of the present invention will be described. One example of the second piezoelectric/electrostrictive device of the present embodiment includes a piezoelectric/electrostrictive portion made of a piezoelectric ceramic and electrodes electrically connected to the piezoelectric/electrostrictive portion. The device is driven by a driving electric field applied to the piezoelectric/electrostrictive portion in a predetermined direction. The piezoelectric/electrostrictive portion is formed by a polarization treatment performed under the conditions that a polarization electric field is applied to the piezoelectric ceramic in a direction reverse to the predetermined direction in which the driving electric field is applied. Details of the device will hereinafter be described.

The piezoelectric/electrostrictive portion constituting the second piezoelectric/electrostrictive device of the present embodiment is a portion formed by polarizing the piezoelectric ceramic under the predetermined conditions. The second piezoelectric/electrostrictive device of the present embodiment is drivable when the driving electric field is applied to the piezoelectric/electrostrictive portion in the predetermined direction.

This piezoelectric/electrostrictive portion is a portion formed by subjecting, to the polarization treatment, the piezoelectric ceramic formed into a desired shape under the conditions that the polarization electric field is applied in the direction reverse to the direction in which the driving electric field is applied. Thus, the polarization electric field is applied in the direction reverse to the direction of the driving electric field applied during actual use. As a result, the device exhibits excellent piezoelectric characteristics and also indicates a characteristic that the device has only a small dependence on a temperature compared with conventional piezoelectric/electrostrictive devices. Since the second piezoelectric/electrostrictive device of the present embodiment is not easily influenced by the temperature as compared with conventional piezoelectric/electrostrictive devices, the device is preferably adopted in an application requiring a micro-displacement even under situations in which the temperature changes.

The piezoelectric/electrostrictive portion constituting the second piezoelectric/electrostrictive device of the present embodiment is made of a piezoelectric ceramic, and this piezoelectric ceramic has a crystal structure capable of reversibly transiting to a tetragonal phase and an orthorhombic phase at a phase transition point as a boundary. It is to be noted that the phase transition point of the piezoelectric ceramic depends on a composition of the ceramic, but is usually −30 to 100° C. It is preferable that such a piezoelectric ceramic of the second piezoelectric/electrostrictive device of the present embodiment is a portion formed by the polarization treatment performed under the conditions that treatment temperature ranges from a first temperature which exceeds a phase transition point to a second temperature which is 50° C. higher than the first temperature. This is because the device exhibits more excellent piezoelectric characteristics and has a further reduced dependence on the temperature. It is further preferable that the portion is formed by the polarization treatment performed under the conditions that the treatment temperature is 5 to 20° C. higher than the phase transition point.

The piezoelectric/electrostrictive device of the present embodiment has only a small dependence on the temperature. More specifically, an absolute value of a difference between a temperature at which a maximum value ($\in_1$) of a dielectric constant measured in a process of raising the temperature is measured and a temperature at which a maximum value ($\in_2$) of a dielectric constant measured in a process of lowering the temperature is measured is preferably 15° C. or less, further preferably 10° C. or less, especially preferably 5° C. or less.

Moreover, the piezoelectric/electrostrictive portion (the piezoelectric ceramic) of the piezoelectric/electrostrictive device of the present embodiment is different from the oriented crystal ceramic disclosed in Patent Document 4 in that crystals are not generally oriented. That is, in the piezoelectric/electrostrictive portion of the piezoelectric/electrostrictive device of the present embodiment, a mass ratio between a content (T) of tetragonal crystals and a content (R) of orthorhombic crystals at 25° C. is usually T:R=2:8 to 10:0, preferably T:R=2:8 to 8:2, further preferably T:R=3:7 to 7:3.

On the other hand, a ratio of a crystal phase (the tetragonal crystals and the orthorhombic crystals) contained in the piezoelectric/electrostrictive portion of the piezoelectric/electrostrictive device of the present embodiment can be measured and calculated by an X-ray diffraction process. More specifically, in a chart obtained by the measurement performed at 25° C. by the X-ray diffraction process, an intensity ($S_1$) of a peak appearing at 2θ=45°±1 corresponds to an a-axis direction. Under the same conditions, an intensity ($S_2$) of a peak appearing at 2θ=46°±1 corresponds to a c-axis direction. Therefore, the content ratio between the tetragonal crystals and the orthorhombic crystals is estimated by a ratio between $S_1$ and $S_2$. Here, a ratio between the peak intensities of the piezoelectric/electrostrictive portion of the piezoelectric/electrostrictive device of the present embodiment is usually $S_1:S_2$=1:5 to 5:1, preferably $S_1:S_2$=1:4 to 4:1, further preferably $S_1:S_2$=1:3 to 3:1.

There is not any special restriction on the composition of the piezoelectric/electrostrictive portion of the piezoelectric/electrostrictive device of the present embodiment as long as the portion is formed under predetermined conditions using the piezoelectric ceramic which can reversibly transit to the tetragonal phase and the orthorhombic phase at the phase transition point as the boundary. Specific examples of the composition include a composition represented by the following general formula (1):

$$\{Li_y(Na_{1-x}K_x)_{1-y}\}_a(Nb_{1-z}Ta_z)O_3 \qquad (1),$$

in which a=0.90 to 1.2 (preferably a=1.00 to 1.2), x=0.2 to 0.8, y=0.02 to 0.2, and z=0.05 to 0.5.

It is to be noted that in a case where the composition of the piezoelectric ceramic is represented by the above general formula (1), a B site (a site including Nb and Ta as constituent metal elements) of this general formula (1) may further include a transition metal element other than Nb and Ta. Examples of the transition metal elements other than Nb and Ta include V, W, Cu, Ni, Co, Fe, Mn, Cr, Ti, Zr, Mo and Zn. In a case where the composition of the piezoelectric ceramic is represented by the above general formula (1), an A site (a site including Li, Na and K as the constituent metal elements) of this general formula (1) may further include elements other than Li, Na and K. Examples of the elements other than Li, Na and K include Ag, La, Ba, Ca and Sr.

Furthermore, in a case where the composition of the piezoelectric ceramic is represented by the above general formula (1), it is preferable that the general formula (1) further includes Sb, because it is possible to manufacture the piezoelectric/electrostrictive device which generates a larger amount of stain and which exhibits a further excellent piezoelectric characteristic.

To manufacture the piezoelectric ceramic for use in forming the piezoelectric/electrostrictive portion, first a compound containing the metal elements is weighed so as to satisfy a ratio (a molar ratio) of each metal element in the composition of the piezoelectric ceramic, and mixed by a mixing method such as ball milling to obtain a mixed slurry. There is not any special restriction on a type of the compound which contains the metal elements, but an oxide of the metal elements, carbonate or the like is preferably used.

The resultant mixed slurry can be dried by using a drier or by performing an operation such as filtering to thereby obtain a mixed material. The resultant mixed material is calcined, and crushed, if necessary, so that the piezoelectric ceramic can be obtained. It is to be noted that the calcining may be performed at a temperature of 750 to 1300° C. The crushing may be performed by a method such as the ball milling.

Subsequently, after the resultant piezoelectric ceramic is formed into an appropriate shape if necessary, the polarization treatment can be performed on the above specific conditions to obtain the piezoelectric/electrostrictive portion.

An average particle diameter of crystal particles constituting the piezoelectric/electrostrictive portion is preferably 0.1 to 10 µm, further preferably 0.2 to 8.5 µm, especially preferably 0.3 to 7 µm. If the average particle diameter is less than 0.1 µm, a domain does not sufficiently develop in the piezoelectric/electrostrictive portion in some case. Therefore, a deterioration of the piezoelectric characteristics is sometimes caused. On the other hand, if the average particle diameter exceeds 10 µm, the domain sufficiently develops in the piezoelectric/electrostrictive portion. However, the domain does not easily move, and the piezoelectric characteristic is sometimes diminished. It is to be noted that the piezoelectric/electrostrictive portion and the electrodes constituting the piezoelectric/electrostrictive device of the present embodiment can be formed into various shapes. Specifically, preferable examples of the shape include a block-like shape (a so-called bulk) and a sheet-like (film-like) shape.

Figure 6:
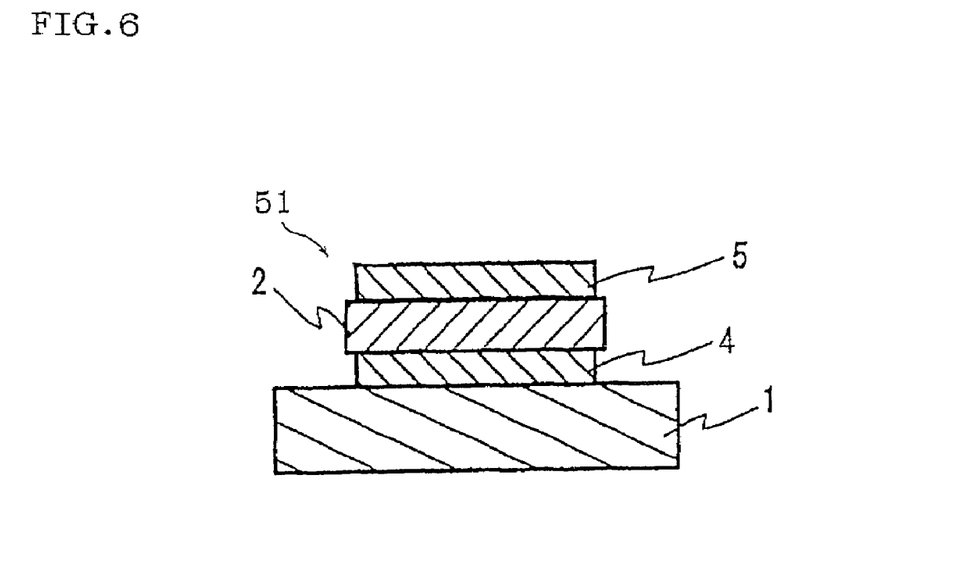
FIG. 6 is a sectional view schematically showing one embodiment of a piezoelectric/electrostrictive device of the present invention.

Next, the embodiment of the piezoelectric/electrostrictive device of the present invention will be described specifically with reference to the drawings. FIG. 6 is a sectional view schematically showing one embodiment of the piezoelectric/electrostrictive device of the present invention. As shown in FIG. 6, a piezoelectric/electrostrictive device 51 of the present embodiment includes a substrate 1 made of a ceramic, a film-like piezoelectric/electrostrictive portion 2 and film-like electrodes 4, 5 electrically connected to this piezoelectric/electrostrictive portion 2. The piezoelectric/electrostrictive portion 2 is secured onto the substrate 1 via the electrode 4. It is to be noted that the piezoelectric/electrostrictive portion may directly be secured onto the substrate without interposing any electrode. It is to be noted that the term "securing" mentioned in the present specification indicates that the piezoelectric/electrostrictive portion 2 is closely integrated with the substrate 1 or the electrode 4 by a solid phase reaction of the both without using any organic or inorganic adhesive.

Figure 8:
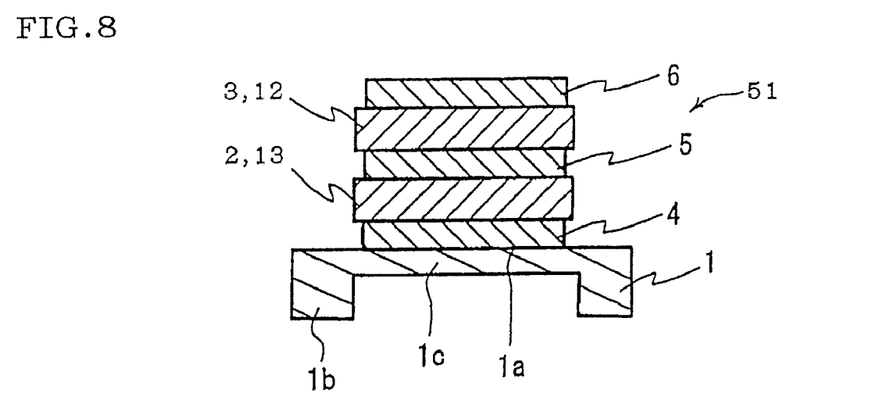
FIG. 8 is a sectional view schematically showing still another embodiment of the piezoelectric/electrostrictive device of the present invention.

The piezoelectric/electrostrictive portion 2 of the piezoelectric/electrostrictive device 51 of the present embodiment is a portion formed by subjecting a piezoelectric ceramic to a polarization treatment under predetermined temperature conditions. As shown in FIG. 8, it is also preferable that the piezoelectric/electrostrictive device 51 of the present embodiment includes a plurality of piezoelectric/electrostrictive portions 2, 3 and a plurality of electrodes 4, 5 and 6 and that the plurality of piezoelectric/electrostrictive portions 2, 3 are alternately sandwiched and laminated by the plurality of electrodes 4, 5 and 6. This constitution is a so-called multilayered constitution, and is preferable because a large flexural displacement can be obtained at a low voltage.

In the piezoelectric/electrostrictive device 51 (see FIG. 6) of the present embodiment, the piezoelectric/electrostrictive portion 2 has a thickness of preferably 0.5 to 50 µm, further preferably 0.8 to 40 µm, especially preferably 1.0 to 30 µm. If the thickness of the piezoelectric/electrostrictive portion 2 is less than 0.5 µm, densification sometimes becomes insufficient. On the other hand, if the thickness of the piezoelectric/electrostrictive portion 2 exceeds 50 µm, a contraction stress of the piezoelectric ceramic during firing increases. To prevent the substrate 1 from being destroyed, the thicker substrate 1 is required, and it is sometimes difficult to cope with miniaturization of the device. It is to be noted that the thicknesses of the piezoelectric/electrostrictive portions 2, 3 in a case where the piezoelectric/electrostrictive device 51 has a so-called multilayered constitution as shown in FIG. 8 are the thicknesses of the respective piezoelectric/electrostrictive portions 2, 3.

The substrate constituting the piezoelectric/electrostrictive device of the embodiment of the present invention is made of a ceramic, but there is not any special restriction on a type of this ceramic. However, from viewpoints of heat resistance, chemical stability and insulation, it is preferable that the ceramic contains at least one selected from the group consisting of stabilized zirconium oxide, aluminum oxide, magnesium oxide, mullite, aluminum nitride, silicon nitride and glass. Above all, stabilized zirconium oxide is further preferable owing to a large mechanical strength and an excellent tenacity. It is to be noted that term "stabilized zirconium oxide" mentioned in the present specification refers to zirconium oxide to which a stabilizer has been added to inhibit the phase transition of the crystals, and which contains partially stabilized zirconium oxide in addition to stabilized zirconium oxide.

Examples of stabilized zirconium oxide include zirconium oxide which contains 1 to 30 mol % of a stabilizer such as calcium oxide, magnesium oxide, yttrium oxide, scandium oxide, ytterbium oxide, cerium oxide or an oxide of a rare earth metal. Above all, it is preferable that yttrium oxide is contained as the stabilizer because the mechanical strength of the vibrating portion is especially high. In this case, preferably 1.5 to 6 mol %, further preferably 2 to 4 mol % of yttrium oxide is contained. It is further preferable that 0.1 to 5 mol % of aluminum oxide is contained. The crystal phase of stabilized zirconium oxide may be a mixed phase of the cubic phase+a monoclinic phase, a mixed phase of the orthorhombic phase+the monoclinic phase, a mixed phase of the cubic phase+the tetragonal phase+the monoclinic phase or the like. From viewpoints of the strength, the tenacity and the durability, it is preferable that a main crystal phase is the tetragonal phase or the mixed phase of the tetragonal phase+the cubic phase.

It is to be noted that a thickness of the substrate is preferably 1 µm to 1 mm, further preferably 1.5 to 500 µm, especially preferably 2 to 200 µm. If the thickness of the substrate is less than 1 µm, the mechanical strength of the piezoelectric/electrostrictive device sometimes deteriorates. On the other hand, in a case where the thickness exceeds 1 mm, when a voltage is applied to the piezoelectric/electrostrictive portion, rigidity of the substrate increases with respect to the generated contraction stress, and the flexural displacement of the piezoelectric/electrostrictive portion sometimes decreases.

Figure 7:
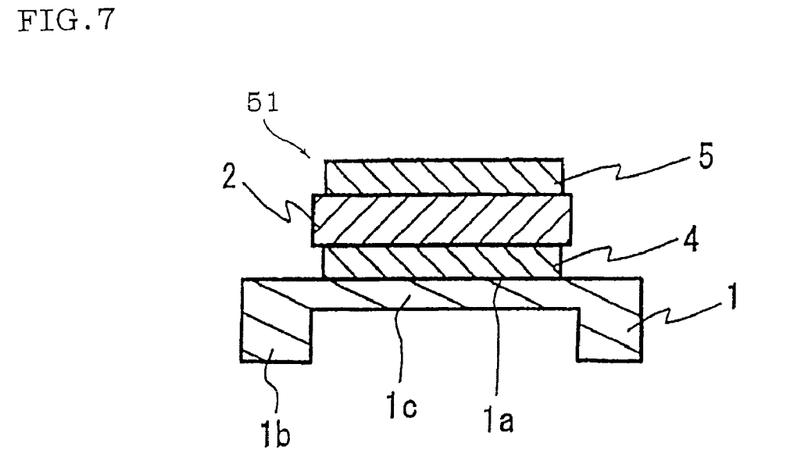
FIG. 7 is a sectional view schematically showing another embodiment of the piezoelectric/electrostrictive device of the present invention.
Figure 9:
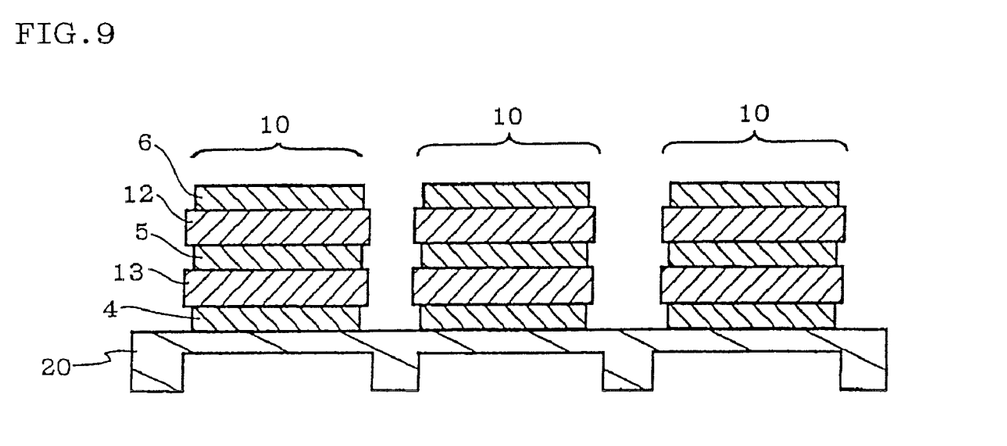
FIG. 9 is a sectional view schematically showing a further embodiment of the piezoelectric/electrostrictive device of the present invention.

However, as shown in FIG. 7, the configuration of the substrate 1 may be a configuration including a thin portion 1c on whose one surface a secured surface 1a is formed and which has the above thickness, and a thick portion 1b disposed on a portion other than a portion corresponding to this secured surface 1a and having a thickness larger than that of the thin portion 1c. It is to be noted that an electrode 4 (or a piezoelectric/electrostrictive portion) is disposed in a region substantially corresponding to the secured surface 1a. When the substrate 1 has such a shape, it is possible to form a piezoelectric/electrostrictive device having a sufficiently large flexural displacement and a large mechanical strength. Moreover, a common substrate 20 shown in FIG. 9 may be used in which the configuration of the substrate 1 shown in FIG. 7 is continuously formed, and a plurality of piezoelectric/electrostrictive device units 10 each including a first piezoelectric/electrostrictive portion 12, a second piezoelectric/electrostrictive portion 13 and electrodes 4, 5 and 6 may be arranged on this common substrate 20.

There is not any special restriction on the surface shape (the shape of a surface to which the electrode 4 is secured in FIG. 6) of the substrate of the piezoelectric/electrostrictive device according to the embodiment of the present invention. Examples of the surface shape include a rectangular shape, a square shape, a triangular shape, an elliptic shape, a circular shape, a curved square shape, a curved rectangular shape and a composite shape obtained by combining these shapes. There is not any special restriction on the shape of the whole substrate, and the shape may be a capsule shape having an appropriate inner space.

In the piezoelectric/electrostrictive device of the present embodiment, it is preferable that the electrodes are electrically connected to the piezoelectric/electrostrictive portions and that the electrode is disposed between the piezoelectric/electrostrictive portions. It is also preferable that the electrode is disposed so as to include a region which substantially contributes to the flexural displacement or the like of the piezoelectric/electrostrictive portion. For example, as shown in FIG. 8, it is preferable that the electrodes 4, 5 and 6 are arranged on a region of 80 area % or more of the surface on which the first piezoelectric/electrostrictive portion 12 and the second piezoelectric/electrostrictive portion 13 are formed, the region including the vicinity of the center of the surface.

In the piezoelectric/electrostrictive device of the present embodiment, examples of a material for the electrode include at least one metal selected from a group consisting of Pt, Pd, Rh, Au, Ag and an alloy of them. Above all, platinum or an alloy containing platinum as a main component is preferable due to the high heat resistance during the firing of the piezoelectric/electrostrictive portion.

In the piezoelectric/electrostrictive device of the present embodiment, the electrode has a thickness of preferably 15 μm or less, further preferably 5 μm or less. If the thickness exceeds 15 μm, the electrode functions as a relaxation layer, and the flexural displacement sometimes decreases. It is to be noted that from a viewpoint that a substantial function of the electrode be exhibited, the electrode may have a thickness of 0.05 μm or more.

Next, a method of manufacturing the piezoelectric/electrostrictive device of the present invention will be described in accordance with an example of the device (a piezoelectric/electrostrictive film type device) including a piezoelectric/electrostrictive portion and electrodes each having a film-like shape and a substrate made of a ceramic. First, on the substrate made of the ceramic or electrodes formed on the surface of the substrate, a layer made of a piezoelectric ceramic is formed. Examples of a method of forming the electrode include an ion beam method, sputtering, vacuum evaporation, PVD, ion plating, CVD, plating, aerosol deposition, screen printing, spraying and dipping. Above all, in respect of a bonding property with respect to the substrate and the piezoelectric/electrostrictive portion, the sputtering method or the screen printing method is preferable. An appropriate temperature is selected in accordance with a material and a forming method of the formed electrode, but the electrode can be integrated with the substrate and/or the piezoelectric/electrostrictive portion by a thermal treatment at about 500 to 1400° C. This thermal treatment may be performed every time the electrode is formed, but may be performed together with firing of a layer made of the piezoelectric ceramic. However, after the layer made of the piezoelectric ceramic is formed, the thermal treatment is not performed at a temperature which exceeds a firing temperature of the layer made of the piezoelectric ceramic.

Examples of a method of forming the layer made of the piezoelectric ceramic on the substrate include the ion beam method, the sputtering, the vacuum evaporation, the PVD, the ion plating, the CVD, the plating, a sol gel method, the aerosol deposition, the screen printing, the spraying and the dipping. Above all, the screen printing method is preferable, because the layer can easily, highly precisely and continuously be formed into a desired shape having an appropriate thickness. It is to be noted that to prepare a piezoelectric/electrostrictive film type device including a plurality of piezoelectric/electrostrictive portions and electrodes and having these portions and electrodes alternately sandwiched and laminated, the electrode is formed on the layer made of the piezoelectric ceramic formed on the substrate by a method similar to the above method. It is to be noted that on this electrode, another layer made of the piezoelectric ceramic and another electrode are alternately and repeatedly formed until a desired multi-layer is obtained.

Subsequently, a laminate body obtained by alternately laminating the layers made of the piezoelectric ceramic and the electrodes on the substrate is integrally fired. This firing can secure the film-like piezoelectric/electrostrictive portion onto the substrate directly or via the film-like electrode. It is to be noted that this firing does not have to be necessarily integrally performed, and may successively be performed every time one layer made of the piezoelectric ceramic is formed. However, from a viewpoint of production efficiency, it is preferable to integrally fire the laminate body including the electrodes.

At this time, the firing temperature is preferably 800 to 1250° C., further preferably 900 to 1200° C. If the temperature is less than 800° C., the substrate or the electrode is incompletely secured to the piezoelectric/electrostrictive portion or the piezoelectric/electrostrictive portion is insufficiently densified in some case. On the other hand, if the temperature exceeds 1250° C., on the contrary, the piezoelectric characteristics of the resultant piezoelectric/electrostrictive portion sometimes deteriorate. Moreover, a maximum temperature retaining time during the firing is preferably one minute or more and ten hours or less, further preferably five minutes or more and four hours or less. If the maximum temperature retaining time is less than one minute, the densification of the piezoelectric/electrostrictive portion easily becomes insufficient, and the desired characteristics cannot be obtained in some cases. If the maximum temperature retaining time exceeds ten hours, on the contrary, a disadvantage that the piezoelectric/electrostrictive characteristics deteriorate is sometimes generated. Subsequently, when the polarization treatment is performed under the above predetermined temperature conditions, a targeted piezoelectric/electrostrictive device can be obtained.

Moreover, to form the whole piezoelectric/electrostrictive portion into a sheet-like shape, a plasticizer, a dispersant, a solvent or the like is added to the piezoelectric ceramic, and the ceramic is formed into a slurry by use of a general mixing device such as a ball mill. Subsequently, the slurry can be formed into a sheet-like shape by a general sheet forming device such as a doctor blade.

Furthermore, a conductive film (a film including a conductive material as a main component) constituting the electrode is formed into a predetermined pattern on the surface of the piezoelectric/electrostrictive portion formed into the sheet-like shape by a technique such as the screen printing. Subsequently, the layers made of the piezoelectric ceramic and the electrodes are alternately laminated and attached under pressure, so that a ceramic green laminate body having a predetermined thickness can be obtained. At this time, when, for example, sheets punched using a punch or a die are laminated, a cell structure can be formed. When the resultant ceramic green laminate body is integrally fired, a fired laminate body can be obtained. It is to be noted that in a case where the cell structure is formed, a cell driving type piezoelectric/electrostrictive device can be obtained. It is to be noted that this firing does not have to be necessarily integrally performed. However, the firing may successively be performed every time one layer made of the piezoelectric ceramic is formed. From the viewpoint of production efficiency, it is preferable to integrally fire the body including the electrodes.

The piezoelectric/electrostrictive device of the present embodiment obtained as described above has remarkably excellent piezoelectric characteristics, and has a characteristic that the device has only a small dependence on the temperature. Therefore, in the piezoelectric/electrostrictive device of the present embodiment, a difference between the maximum value and the minimum value of the strain ratio (=the minimum strain value/the maximum strain value) in a range of 25 to 70° C. is usually 0.2 or less, preferably 0.15 or less, further preferably 0.1 or less, especially preferably 0.06 or less. Moreover, a ratio of a change of the strain with the temperature in a range of 25 to 70° C. is usually 10% or less, preferably 8% or less, further preferably 5% or less. Therefore, the piezoelectric/electrostrictive device of the present embodiment is preferably used as an actuator or a sensor by use of the excellent characteristics of the device.

EXAMPLES

The present invention will hereinafter be described specifically in accordance with examples, but the present invention is not limited to these examples. Measurement methods of various physical property values and evaluation methods of miscellaneous characteristics will hereinafter be described.

[Strain (electric field-induced strain)]: A strain gauge was attached to an electrode, and a strain amount in a direction vertical to that of an electric field in a case where a voltage of 4 kV/mm was applied was measured as the strain (the electric field-induced strain) (ppm).

[Dielectric Constant]: The dielectric constant was measured using an impedance analyzer on conditions that a frequency=1 kHz and a voltage=0.5 V.

[$d_{31}$ Constant]: The constant was measured in accordance with the standard EMAS-6100 "Electric Test Method of Piezoelectric Ceramic Vibrator" of Electronic Materials Manufacturers Association of Japan.

Example 1

Predetermined amounts of $Li_2CO_3$, $C_4H_5O_6Na.H_2O$, $C_4H_5O_6K$, $Nb_2O_5$ and $Ta_2O_5$ were mixed in alcohol for 16 hours to prepare a mixture. The resultant mixture was calcined at 750° C. for five hours, and then crushed with a ball mill to thereby prepare a piezoelectric ceramic (a phase transition point=68° C.) having a composition represented by "$(Li_{0.052}Na_{0.502}K_{0.446})_{1.01}(Nb_{0.918}Ta_{0.082})O_3$". The resultant piezoelectric ceramic was subjected to powder compacting at a pressure of $2t/cm^2$ to obtain a green compact having a diameter of 20 mm×a thickness of 6 mm. The resultant green compact was stored in an alumina container, and sintered at 1000° C. for three hours to obtain a sintered compact. The resultant sintered compact was processed into a size of 12 mm×3 mm×1 mm, opposite surfaces of the body were coated with a silver paste to form electrodes by baking, and this body was immersed into a silicon oil at 75° C. Moreover, a direct-current voltage of 4 kV/mm was applied between the electrodes for 15 minutes to perform a polarization treatment, thereby obtaining a piezoelectric/electrostrictive device (Example 1).

The strain ratio (=the minimum strain value/the maximum strain value) of the resultant piezoelectric/electrostrictive device is shown in Table 1. Strains (ppm) and strain ratios (=the minimum strain values/the maximum strain values at temperatures) of the resultant piezoelectric/electrostrictive device at 25 to 70° C. are shown in Table 2.

Comparative Example 1

A piezoelectric/electrostrictive device (Comparative Example 1) was obtained by an operation similar to that of Example 1 described above except that the device was submerged into a silicon oil at 25° C. to perform a polarization treatment. A strain ratio (=the minimum strain value/the maximum strain value) of the resultant piezoelectric/electrostrictive device is shown in Table 1. Strains (ppm) at 25 to 70° C. and strain ratios (=the minimum strain values/the maximum strain values at the temperatures) of the resultant piezoelectric/electrostrictive device are shown in Table 2.

TABLE 1

|  | Polarization treatment temperature | Strain ratio*[1] |
|---|---|---|
| Comparative Example 1 | 25 | 0.69 |
| Example 1 | 75 | 0.90 |

*[1]the strain ratio = the minimum strain value/the maximum strain value

TABLE 2

| Temperature (° C.) | Strain (ppm) | | Strain ratio*[1] | |
|---|---|---|---|---|
|  | Comparative Example 1 | Example 1 | Comparative Example 1 | Example 1 |
| 25 | 525 | 740 | 0.69 | 0.90 |
| 30 | 525 | 745 | 0.69 | 0.91 |
| 40 | 560 | 780 | 0.74 | 0.95 |
| 50 | 710 | 820 | 0.93 | 1.00 |
| 60 | 760 | 800 | 1.00 | 0.98 |
| 70 | 590 | 770 | 0.78 | 0.94 |

*[1]the strain ratio = the minimum strain value/the maximum strain value

Figure 1:
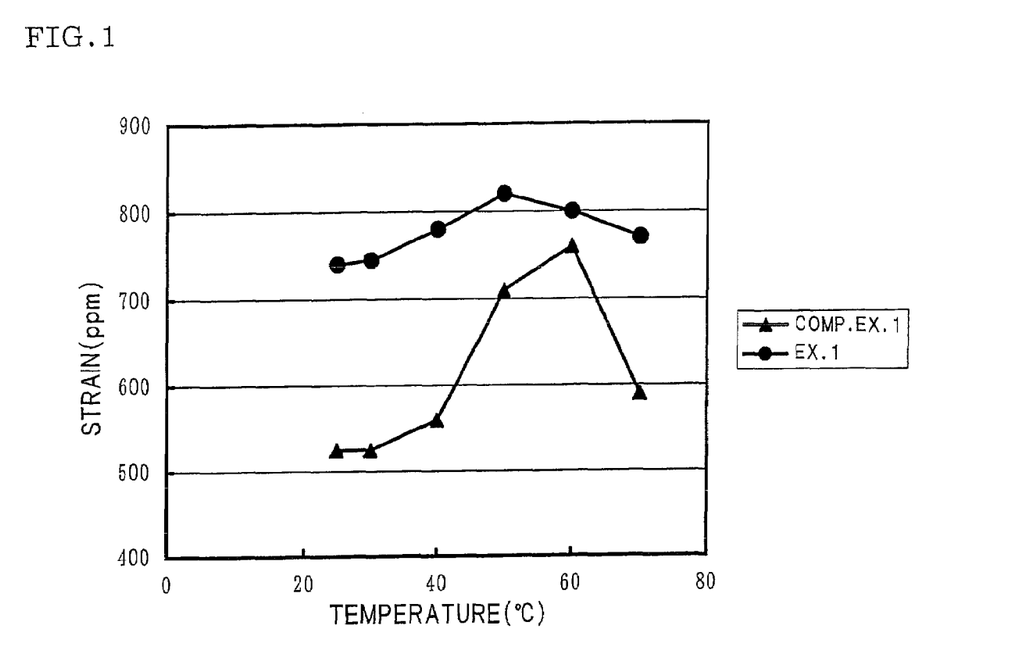
FIG. 1 is a graph in which strains (ppm) of piezoelectric/electrostrictive device of Example 1 and Comparative Example 1 are plotted with respect to temperatures (° C.).
Figure 2:
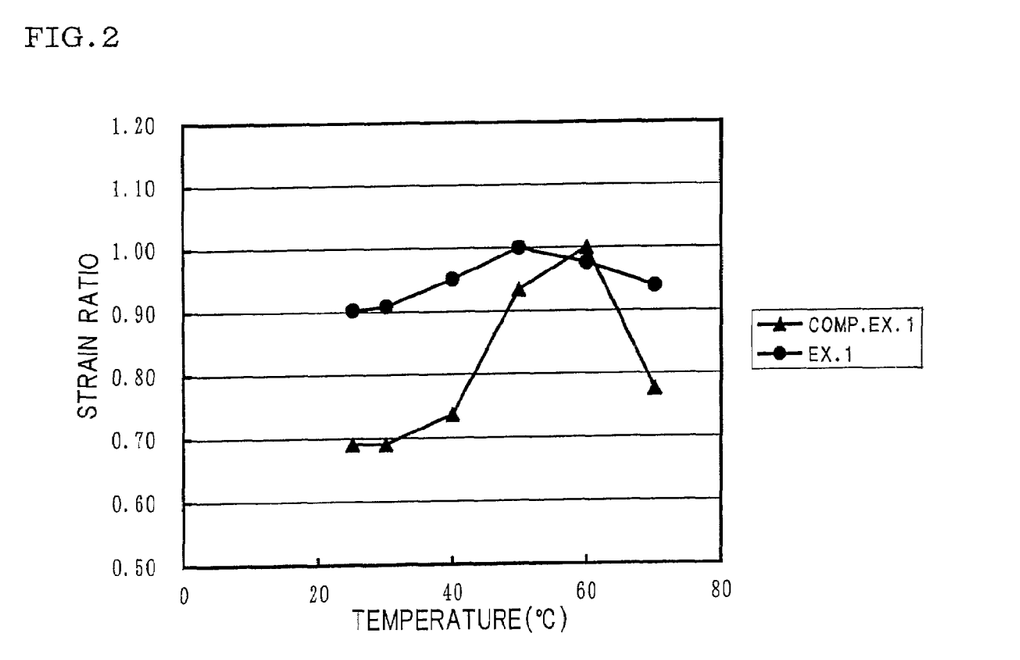
FIG. 2 is a graph in which strain ratios of the piezoelectric/electrostrictive device of Example 1 and Comparative Example 1 are plotted with respect to the temperatures (° C.).

It is to be noted that FIG. 1 shows a graph in which the strains (ppm) of the piezoelectric/electrostrictive device of Example 1 and Comparative Example 1 are plotted with respect to the temperatures (° C.). FIG. 2 shows a graph in which the strain ratios of the piezoelectric/electrostrictive device of Example 1 and Comparative Example 1 are plotted with respect to the temperatures (° C.).

(Considerations)

It is clear from the results shown in Tables 1 and 2 that the strain ratio of the piezoelectric/electrostrictive device of Example 1 is closer to one as compared with the piezoelectric/electrostrictive device of Comparative Example 1. This indicates that the piezoelectric/electrostrictive device of Example 1 has a smaller dependence on the temperature. It is clear from the results shown in FIGS. 1 and 2 that the piezoelectric/electrostrictive device of Example 1 has less strain fluctuations with the temperatures compared with the piezoelectric/electrostrictive device of Comparative Example 1.

Example 2

Predetermined amounts of $Li_2CO_3$, $C_4H_5O_6Na \cdot H_2O$, $C_4H_5O_6K$, $Nb_2O_5$ and $Ta_2O_5$ were mixed in alcohol for 16 hours to prepare a mixture. The resultant mixture was calcined at 750° C. for five hours, and then crushed with a ball mill to thereby prepare a piezoelectric ceramic (a phase transition point=58° C.) having a composition represented by "$(Li_{0.057}Na_{0.519}K_{0.424})_{1.01}(Nb_{0.918}Ta_{0.082})O_3$". The resultant piezoelectric ceramic was subjected to powder compacting at a pressure of 2 t/cm² to obtain a green compact having a diameter of 20 mm×a thickness of 6 mm. The resultant green compact was stored in an alumina container, and fired at 1000° C. for three hours to obtain a sintered compact. The resultant sintered compact was processed into a size of 12 mm×3 mm×1 mm, opposite surfaces of the body were coated with a silver paste to form electrodes by baking, and this body was immersed into a silicon oil at 75° C. Moreover, a direct-current voltage of 4 kV/mm was applied between the electrodes for 15 minutes to perform a polarization treatment, thereby obtaining a piezoelectric/electrostrictive device (Example 2).

Figure 4:
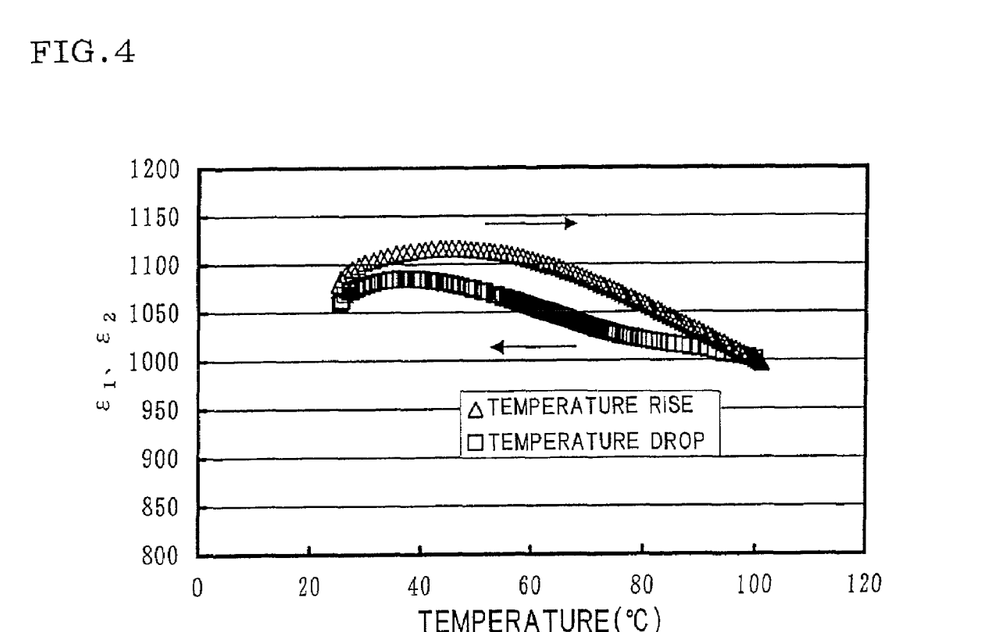
FIG. 4 is a graph in which dielectric constants of a piezoelectric/electrostrictive device of Example 2 are plotted with respect to the temperatures (° C.).

Table 3 shows dielectric constants $\in_1$ of the resultant piezoelectric/electrostrictive device measured at temperatures in a case where the temperature is raised from 25° C. to 100° C. and dielectric constants $\in_2$ measured at the temperatures in a case where the temperature is lowered from 100° C. to 25° C. FIG. 4 shows a graph in which dielectric constants of the piezoelectric/electrostrictive device of Example 2 are plotted with respect to the temperatures (° C.).

Comparative Example 2

Figure 3:
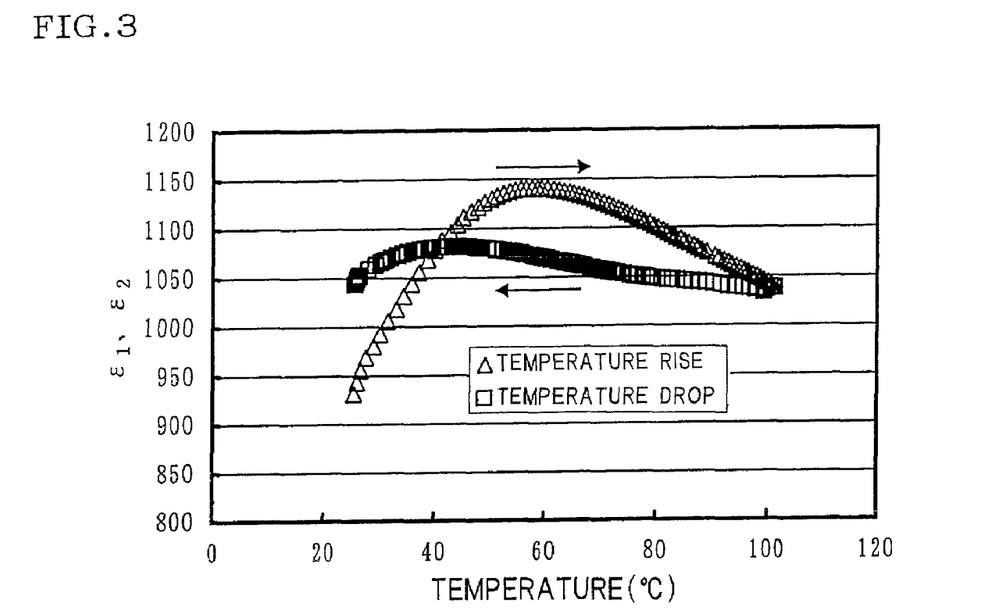
FIG. 3 is a graph in which dielectric constants of a piezoelectric/electrostrictive device of Comparative Example 2 are plotted with respect to the temperatures (° C.).

A piezoelectric/electrostrictive device (Comparative Example 2) was obtained by an operation similar to that of Example 2 described above except that the device was submerged into a silicon oil at 25° C. to perform a polarization treatment. Table 3 shows dielectric constants $\in_1$ of the resultant piezoelectric/electrostrictive device measured at temperatures in a case where the temperature is raised from 25° C. to 100° C. and dielectric constants $\in_2$ measured at the temperatures in a case where the temperature is lowered from 100° C. to 25° C. FIG. 3 shows a graph in which dielectric constants of the piezoelectric/electrostrictive device of Comparative Example 2 are plotted with respect to the temperatures (° C.).

TABLE 3

|  | Temperature*1 (° C.) | $\in_1$ | Temperature*2 (° C.) | $\in_2$ |
|---|---|---|---|---|
| Comparative Example 2 | 25 | 930 | 100 | 1044 |
|  | 30 | 993 | 90 | 1042 |
|  | 40 | 1078 | 80 | 1048 |
|  | 50 | 1130 | 70 | 1057 |
|  | 60 | 1140 | 60 | 1070 |
|  | 70 | 1128 | 50 | 1079 |
|  | 80 | 1100 | 40 | 1081 |
|  | 90 | 1073 | 30 | 1066 |
|  | 100 | 1044 | 25 | 1044 |
| Example 2 | 25 | 1079 | 100 | 1001 |
|  | 30 | 1102 | 90 | 1012 |
|  | 40 | 1114 | 80 | 1021 |
|  | 50 | 1115 | 70 | 1036 |
|  | 60 | 1104 | 60 | 1055 |
|  | 70 | 1185 | 50 | 1074 |
|  | 80 | 1158 | 40 | 1084 |
|  | 90 | 1031 | 30 | 1079 |
|  | 100 | 1001 | 25 | 1059 |

*1Temperature rises from 25° C. to 100° C.
*2Temperature drops from 100° C. to 25° C.

(Considerations)

It is apparent from results shown in Table 3 and FIGS. 3 and 4 that the piezoelectric/electrostrictive device of Example 2 has only a small difference between a value of the dielectric constant ($\in_1$) measured at a time when the temperature rises and a value of the dielectric constant ($\in_2$) measured at a time when the temperature drops as compared with the piezoelectric/electrostrictive device of Comparative Example 2. That is, as clear even from comparison between FIGS. 3 and 4, in the piezoelectric/electrostrictive device of Example 2, the dielectric constant measured during the temperature rise is substantially equal to that measured during the temperature drop. In the piezoelectric/electrostrictive device of Example 2, the temperature at which the maximum value of the dielectric constant measured during the temperature rise is measured is substantially equal to the temperature at which the maximum value of the dielectric constant measured during the temperature drop is measured. It is clear from these facts that the piezoelectric/electrostrictive device of Example 2 does not easily generate a temperature hysteresis.

Examples 3, 4, Comparative Example 3

Figure 5:
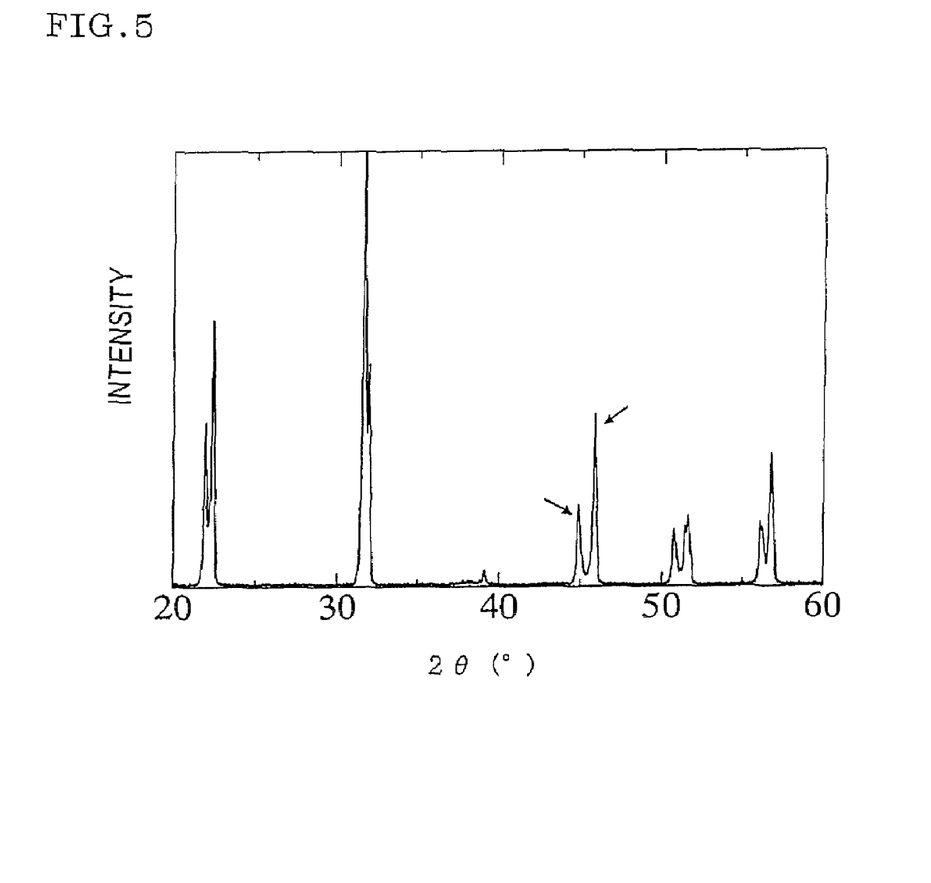
FIG. 5 is an XRD chart of a piezoelectric/electrostrictive portion of a piezoelectric/electrostrictive device of Example 3.

Piezoelectric/electrostrictive device (Examples 3, 4, Comparative Example 3) were obtained by an operation similar to that of Example 2 described above except that the device were immersed into a silicon oil at 25° C., 65° C. and 85° C. to perform polarization treatments, respectively. Table 4 shows $d_{31}$ constants and strains (ppm) of the resultant piezoelectric/electrostrictive. FIG. 5 shows an XRD chart of a piezoelectric/electrostrictive portion of the piezoelectric/electrostrictive device of Example 3.

TABLE 4

|  | Polarization treatment temperature (° C.) | $d_{31}$ constant | Strain (ppm) |
|---|---|---|---|
| Comparative Example 3 | 25 | 65 | 520 |
| Example 3 | 65 | 71 | 740 |
| Example 4 | 85 | 64 | 666 |

(Considerations)

It is clear from the results shown in Table 4 that the piezoelectric/electrostrictive device of Examples 3, 4 have large strain values and exhibit satisfactory piezoelectric characteristics as compared with the piezoelectric/electrostrictive device of Comparative Example 3. It is also clear that the piezoelectric/electrostrictive device of Example 3 subjected to the polarization treatment at a temperature which is 7° C. higher than a phase transition point has a larger strain value, a larger value of the $d_{31}$ constant and a more excellent piezoelectric characteristic as compared with the piezoelectric/electrostrictive device of Example 4 subjected to the polarization treatment at a temperature 27° C. higher than the phase transition point.

Example 5

The same piezoelectric/electrostrictive device (Example 5) as that of Example 1 was obtained except that directions of electrodes were set so that a direction in which a driving electric field was applied was reverse to a direction in which a polarization electric field was applied.

Figure 10:
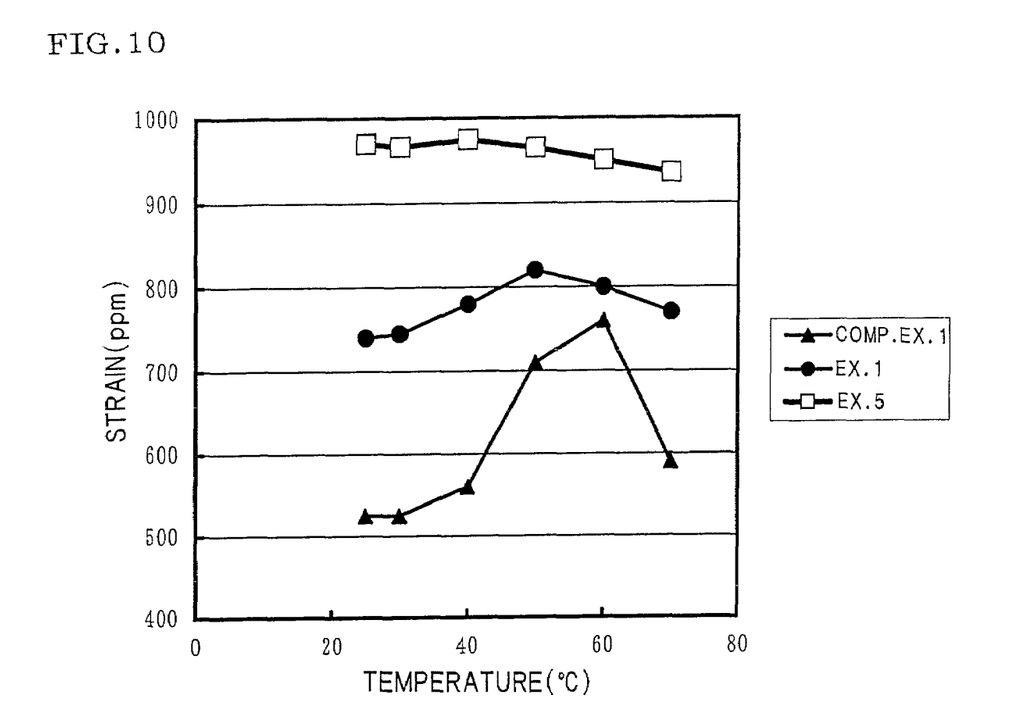
FIG. 10 is a graph in which strains (ppm) of piezoelectric/electrostrictive device of Examples 1, 5 and Comparative Example 1 are plotted with respect to the temperatures (° C.).
Figure 11:
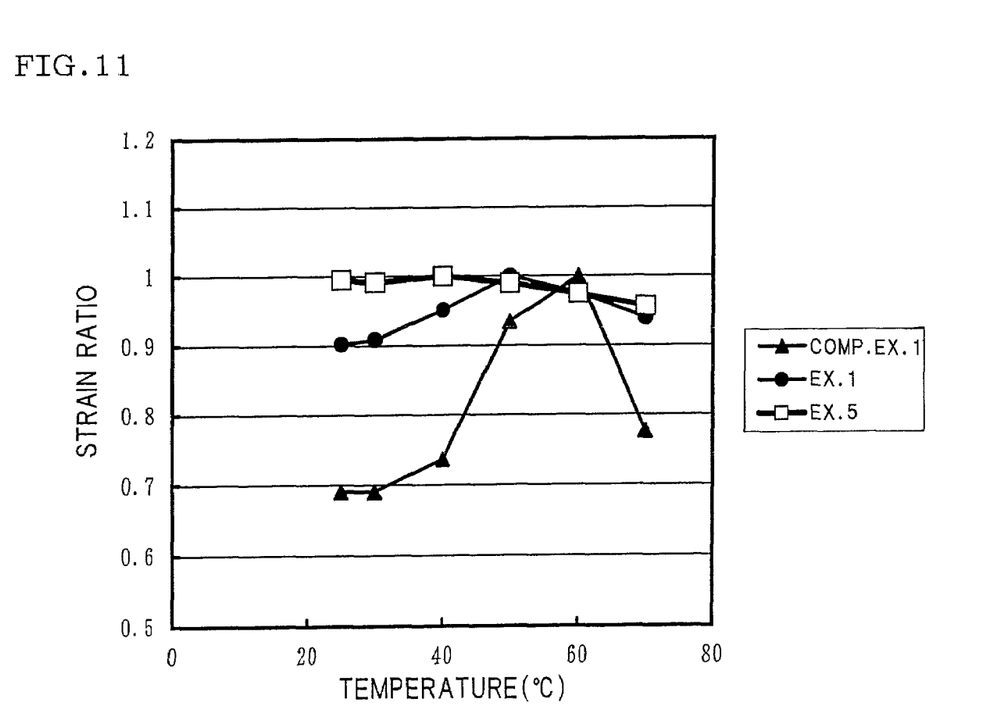
FIG. 11 is a graph in which strain ratios of the piezoelectric/electrostrictive device of Examples 1, 5 and Comparative Example 1 are plotted with respect to the temperatures (° C.).

Table 5 shows strains (ppm) at 25 to 70° C. and strain ratios (=the minimum strain values/the maximum strain values at the temperatures) of the piezoelectric/electrostrictive device of Examples 1, 5 and Comparative Example 1. Table 6 shows strain ratios (=the minimum strain values/the maximum strain values) of the piezoelectric/electrostrictive device of Examples 1, 5 and Comparative Example 1. Furthermore, FIG. 10 shows a graph in which strains (ppm) of the piezoelectric/electrostrictive device of Examples 1, 5 and Comparative Example 1 are plotted with respect to temperatures (° C.). FIG. 11 shows a graph in which strain ratios of the piezoelectric/electrostrictive device of Examples 1, 5 and Comparative Example 1 are plotted with respect to the temperatures (° C.)

TABLE 5

| Temperature (° C.) | Strain (ppm) | | | Strain ratio[*1] | | |
|---|---|---|---|---|---|---|
| | C. Ex. 1 | Ex. 1 | Ex. 5 | C. Ex. 1 | Ex. 1 | Ex. 5 |
| 25 | 525 | 740 | 970 | 0.69 | 0.90 | 0.99 |
| 30 | 525 | 745 | 966 | 0.69 | 0.91 | 0.99 |
| 40 | 560 | 780 | 975 | 0.74 | 0.95 | 1.00 |
| 50 | 710 | 820 | 965 | 0.93 | 1.00 | 0.99 |
| 60 | 760 | 800 | 950 | 1.00 | 0.98 | 0.97 |
| 70 | 590 | 770 | 935 | 0.78 | 0.94 | 0.96 |

[*1]Strain ratio = minimum strain value/maximum strain value

TABLE 6

| | Polarization treatment temperature (° C.) | Strain ratio[*1] | Applying direction of driving electric field[*2] |
|---|---|---|---|
| Comparative Example 1 | 25 | 0.69 | Same direction |
| Example 1 | 75 | 0.90 | Same direction |
| Example 5 | 75 | 0.96 | Reverse direction |

[*1]Strain ratio = minimum strain value/maximum strain value
[*2]Direction with respect to the direction in which the polarization electric field was applied (Consideration)

It is clear from the results shown in Tables 5 and 6 that the strain ratios of the piezoelectric/electrostrictive device of Examples 1 and 5 are closer to one as compared with the piezoelectric/electrostrictive device of Comparative Example 1. This indicates that the piezoelectric/electrostrictive device of Examples 1 and 5 have smaller dependences on the temperatures. It is clear from the results shown in FIGS. 10 and 11 that the piezoelectric/electrostrictive device of Examples 1 and 5 have less strain fluctuations with the temperatures compared with the piezoelectric/electrostrictive device of Comparative Example 1.

Furthermore, in the piezoelectric/electrostrictive device of Example 5 in which the direction to apply the driving electric field is reverse to the direction to apply the polarization electric field, the device has a smaller dependence on the temperature and a larger strain amount as compared with the piezoelectric/electrostrictive device of Example 1 in which the direction to apply the driving electric field is the same as the direction to apply the polarization electric field.

Piezoelectric/electrostrictive devices of the present invention are preferable as various actuators, sensors and the like.

What is claimed is:

1. A piezoelectric/electrostrictive device comprising:
   a piezoelectric/electrostrictive portion made of a piezoelectric ceramic having a composition represented by the following general formula (1):

$$\{Li_y(Na_{1-x}K_x)_{1-y}\}_a(Nb_{1-z}Ta_z)O_3 \quad (1),$$

in which a=0.90 to 1.2, x=0.2 to 0.8, y=0.02 to 0.2, and z=0.05 to 0.5; and
   electrodes electrically connected to the piezoelectric/electrostrictive portion;
   wherein the piezoelectric ceramic is configured to reversibly transit to a tetragonal phase and an orthorhombic phase at a phase transition point as a boundary;
   wherein the piezoelectric/electrostrictive portion is formed by a polarization treatment performed under conditions wherein a treatment temperature ranges from a first temperature which exceeds the phase transition point of the piezoelectric ceramic to a second temperature which is 50° C. higher than the first temperature; and
   wherein in the piezoelectric/electrostrictive portion, a mass ratio of a content (T) of tetragonal crystals and a content (R) of orthorhombic crystals at 25° C. is in a range of T:R=2:8 to 10:0.

2. The piezoelectric/electrostrictive device according to claim 1, wherein the piezoelectric/electrostrictive device is driven by a driving electric field applied to the piezoelectric/electrostrictive portion in a predetermined direction; and
   wherein the polarization treatment is performed under conditions wherein a polarization electric field is applied to the piezoelectric ceramic in a direction reverse to the predetermined direction in which the driving electric field is applied.

3. The piezoelectric/electrostrictive device according to claim 1, wherein a difference between a maximum value and a minimum value of a strain ratio in a range of 25 to 70° C. is 0.2 or less, the ratio being represented by a ratio of a minimum value of a strain with respect to a maximum value of the strain.

4. The piezoelectric/electrostrictive device according to claim 1, wherein in the piezoelectric/electrostrictive portion, an absolute value of a difference between a temperature at which a maximum value ($\in_1$) of a dielectric constant measured in a process of raising the temperature is measured and a temperature at which a maximum value ($\in_2$) of a dielectric constant measured in a process of lowering temperature is measured is 15° C. or less.

5. The piezoelectric/electrostrictive device according to claim 1, wherein in a chart of the piezoelectric/electrostrictive portion obtained by measurement performed at 25° C. by an X-ray diffraction process, a ratio between an intensity ($S_1$) of a peak which appears at $2\theta=45°\pm1$ and an intensity ($S_2$) of a peak which appears at $2\theta=46°\pm1$ is in a range of $S_1:S_2=1:5$ to 5:1.

6. The piezoelectric/electrostrictive device according to claim 1, wherein the piezoelectric/electrostrictive portion and the electrodes have film-like shapes, respectively; and
   wherein the piezoelectric/electrostrictive device further comprises a ceramic substrate, and the piezoelectric/electrostrictive portion is secured to the ceramic substrate directly or via the electrodes.

7. The piezoelectric/electrostrictive device according to claim 1, which is used as an actuator or a sensor.

8. The piezoelectric/electrostrictive device according to claim 1, wherein the component of the general formula (1) including Nb and Ta further includes a transition metal element selected from the group consisting of V, W, Cu, Ni, Co, Fe, Mn, Cr, Ti, Zr, Mo and Zn.

9. The piezoelectric/electrostrictive device according to claim 1, wherein the component of the general formula (1) including Li, Na and K further includes at least one element selected from the group consisting of Ag, La, Ba, Ca and Sr.

10. The piezoelectric/electrostrictive according to claim 1, wherein the piezoelectric ceramic further includes Sb.

* * * * *